(12) United States Patent
Lundgren et al.

(10) Patent No.: US 11,095,139 B2
(45) Date of Patent: Aug. 17, 2021

(54) ADAPTIVE BATTERY CHARGING

(71) Applicant: Microsoft Technology Licensing, LLC, Redmond, WA (US)

(72) Inventors: Mika-Petteri Lundgren, Salo (FI); Juha Kuusisto, Salo (FI); Markus Aaltonen, Turku (FI); Jarno Rajala, Kaarina (FI); Markku Rajamaki, Kaarina (FI)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/775,236

(22) Filed: Jan. 28, 2020

(65) Prior Publication Data
US 2020/0169102 A1    May 28, 2020

Related U.S. Application Data

(63) Continuation of application No. 14/851,392, filed on Sep. 11, 2015, now Pat. No. 10,587,135.

(51) Int. Cl.
*H02J 7/00* (2006.01)
*H01M 10/44* (2006.01)
(Continued)

(52) U.S. Cl.
CPC .......... *H02J 7/0047* (2013.01); *G01R 31/385* (2019.01); *G01R 31/389* (2019.01);
(Continued)

(58) Field of Classification Search
CPC .......... H02J 7/007; H02J 7/047; H02J 7/0091; H02J 7/00712; H02J 7/007188;
(Continued)

(56) References Cited

U.S. PATENT DOCUMENTS 8,947,050 B2 *   2/2015   Gale ........................ B60L 58/16
                                                              320/134
2002/0011822 A1   1/2002   Sakai et al.
(Continued)

FOREIGN PATENT DOCUMENTS

CN    101416330 A    4/2009
CN    102427963 A    4/2012

OTHER PUBLICATIONS

"First Office Action and Search Report Issued in Chinese Patent Application No. 201680053018.5", dated Jun. 30, 2020, 15 Pages.
(Continued)

*Primary Examiner* — David V Henze-Gongola

(57) ABSTRACT

In an embodiment, adaptive charging of a battery is disclosed. In an embodiment, a device is disclosed comprising: a battery; at least one sensor configured to sense an outward pressure exerted by the battery; a monitoring module configured to monitor the outward pressure of the battery and at least one of a temperature, an age, a manufacturer, a state of charge, an impedance, and number of charging cycles of the battery; a control module configured to select a charging profile for the battery based on at least one of the sensed and/or monitored battery related variables; and a charging module configured to charge the battery according to a charging profile selected by the control module.

20 Claims, 9 Drawing Sheets

(51) Int. Cl.
  *G01R 31/392*  (2019.01)
  *G01R 31/389*  (2019.01)
  *G01R 31/385*  (2019.01)

(52) U.S. Cl.
  CPC ........ *G01R 31/392* (2019.01); *H01M 10/445* (2013.01); *H02J 7/0088* (2013.01); *H02J 7/007186* (2020.01)

(58) Field of Classification Search
  CPC .... H02J 7/0047; H02J 7/007186; H02J 7/005; H02J 7/0048; G01R 31/3679; G01R 31/3686; G01R 31/3689; G01R 31/36–396
  See application file for complete search history.

(56) References Cited

U.S. PATENT DOCUMENTS

| | | | | |
|---|---|---|---|---|
| 2007/0063675 A1* | 3/2007 | Walline | ............... | H01M 10/488 320/132 |
| 2010/0013430 A1* | 1/2010 | Manor | ............... | H02J 7/00041 320/106 |
| 2010/0244846 A1* | 9/2010 | Desprez | ............... | G01R 31/392 324/427 |
| 2012/0068715 A1* | 3/2012 | Martaeng | ............... | B60L 58/22 324/434 |
| 2013/0328530 A1* | 12/2013 | Beaston | ............... | H02J 3/386 320/128 |
| 2014/0342193 A1* | 11/2014 | Mull | ............... | H01M 10/4257 429/50 |
| 2015/0064510 A1* | 3/2015 | Wang | ............... | H01M 10/486 429/50 |
| 2015/0165919 A1* | 6/2015 | Hughes | ............... | B60L 11/1809 320/109 |
| 2017/0033582 A1* | 2/2017 | Lei | ............... | H02J 7/007184 |

OTHER PUBLICATIONS

"Office Action issued in European Patent Application No. 16753530.1", dated Jan. 20, 2021, 4 Pages.

"Second Office Action Issued in Chinese Patent Application No. 201680053018.5", dated Mar. 19, 2021, 14 Page.

* cited by examiner

ADAPTIVE BATTERY CHARGING

RELATED APPLICATIONS

This application is a continuation application that claims priority to U.S. application Ser. No. 14/851,392, filed on Sep. 11, 2015, and entitled "ADAPTIVE BATTERY CHARGING," the disclosure of which is hereby incorporated by reference in its entirety.

BACKGROUND

Portable electronic devices may comprise an electrochemical battery as a power source. Such a battery may be rechargeable in situ. Rechargeable batteries may swell both over their life time and during charging. Battery swelling may depend upon various factors, including battery chemistry, charging voltages, charging current. Rechargeable batteries may also lose capacity over the course of their life time.

SUMMARY

This Summary is provided to introduce a selection of concepts in a simplified form that are further described below in the detailed description. This summary is not intended to identify key features or essential features of the claimed subject matter, nor is it intended to be used to limit the scope of the claimed subject matter.

In one example, a device comprises a battery; at least one sensor configured to sense an outward pressure exerted by the battery; a monitoring module configured to monitor the outward pressure of the battery and at least one of a temperature of the battery, an age of the battery, a manufacturer of the battery, a state of charge of the battery, an impedance of the battery, and number of charging cycles of the battery; a control module configured to select a charging profile for the battery; and a charging module configured to charge the battery according to the charging profile selected by the control module; wherein the selection of the charging profile is based on at least one of: the outward pressure exerted by the battery; a rate of change in the outward pressure exerted by the battery; an impedance of the battery; a rate of change of the impedance of the battery; a number of charging cycles of the battery; a temperature of the battery; and an age of the battery.

Other embodiments relate to a mobile device and a method for the adaptively charging a battery.

Many of the attendant features will be more readily appreciated as they become better understood by reference to the following detailed description considered in connection with the accompanying drawings.

DESCRIPTION OF THE DRAWINGS

The present description will be better understood from the following detailed description read in light of the accompanying drawings, wherein.

Like references are used to designate like parts in the accompanying drawings.

DETAILED DESCRIPTION

The detailed description provided below in connection with the appended drawings is intended as a description of the present embodiments and is not intended to represent the only forms in which the present embodiment may be constructed or utilized. However, the same or equivalent functions and sequences may be accomplished by different embodiments.

Although the present embodiments may be described and illustrated herein as being implemented in a smartphone or a mobile phone, these are only illustrative examples and not a limitation. As those skilled in the art will appreciate, the present embodiments are suitable for application in a variety of different types of devices, for example, in tablets, phablets, portable computers, cameras, game consoles, small computers, laptops, smartwatches, wearable gadgets etc., which comprise a rechargeable battery.

Figure 1:
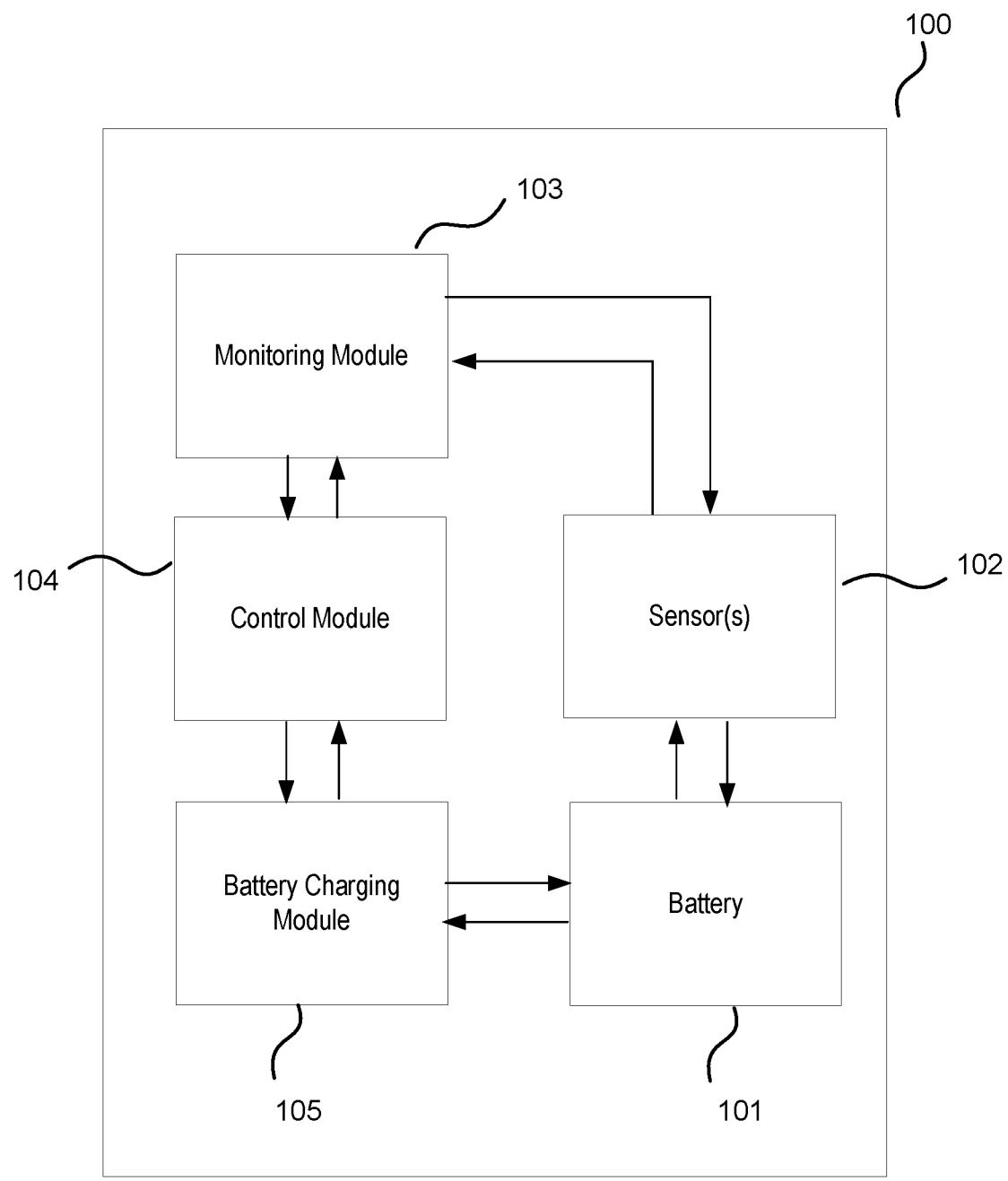
FIG. 1 illustrates a schematic representation of a device with adaptive battery charging according to an embodiment.

An embodiment of a device is illustrated in FIG. 1. A device 100 may comprise a battery 101, at least one sensor 102, a monitoring module 103, a control module 104 and a battery charging module 105.

In an embodiment illustrated in FIG. 1, the battery 101 may be configured to provide power to the device 100 and the battery charging module may be configured to charge the battery when the device is connected to an external power supply (not illustrated in FIG. 1). Control module 104 may be configured to be in communication with a monitoring module 103 and a battery charging module 105. The monitoring module 103 may be configured to be in communication with at least one sensor 102. The at least one sensor 102 may be configured to sense various battery related parameters, including at least an outward pressure exerted by the battery 101.

According to an embodiment battery 101 may be any rechargeable battery of the type suitable for portable electronic devices. Such batteries may include, non-exhaustively, Li-Ion batteries, Li-polymer batteries, Lithium Manganese Oxide batteries, Lithium Iron phosphate batteries, Lithium Graphene batteries etc. According to an embodiment, a battery may include a single electrochemical cell. According to another embodiment, a battery may include multiple electrochemical cells. According to yet another embodiment, a battery may include a battery bank. According to an embodiment, a battery may comprise electronic circuitry.

Referring to FIG. 1, according to an embodiment control module 104 may be configured to select a charging profile. A charging profile may be one or more of: a range of charging voltage, a range of charging current, a range of charging temperature, a range of state of a charge of the battery. The battery charging module 105 may be configured to charge the battery 101 based upon a charging profile selected by the control module 104. The control module 104 may select a charging profile based, at least in part, upon information received from the monitoring module 103. The monitoring module 103 may be configured to monitor battery parameters like battery impedance, battery temperature, battery state of charge, an outward pressure exerted by the battery, battery age, battery cycle count etc., some of which may be sensed by at least one sensor 102. It should be noted that although the at least one sensor 102 is illustrated as a discrete block, it is for illustrative purposes only, at least one sensor 102 can be a distributed around the battery or may be include in or its functionality performed by, for example, the battery charging module 105. According to an embodiment, a battery cycle is a battery charge-discharge cycle in any time order.

The monitoring module 104 may select or generate a charging profile based upon a combinative parameter passing at least one threshold. The at least one threshold may be for example specified at the time of manufacture of the device 100 or the control module 104 may compute new thresholds based upon data like manufacturer of a battery 101. The combinative parameter may be based on a combination of an outward pressure exerted by the battery 101 and various battery 101 related variables like battery impedance, battery state of charge, battery temperature, rate of change of these battery related variables, etc., as reported by the monitoring module 103. The control module 104 may assign weights to each battery 101 related variable when computing the combinative parameter. In an embodiment, when a certain threshold is passed by a battery related variable, its weight may be adjusted by the control module 104. In an embodiment, when a combinative parameter or a battery related threshold is passed, the control module 104 may set new thresholds for some or all of the individual battery related variables and/or the combinative parameter.

According to an embodiment, charging profile may comprise charging a battery while maintaining a charging voltage and/or a charging current within a specified range. According to another embodiment, charging profile may comprise charging a battery only when a battery temperature and/or a battery state of charge is determined to be within a specified range. According to yet another embodiment, charging profile may comprise maintaining a charging voltage and/or current within a specified range while the battery temperature and/or state of charge is within a specified range.

An embodiment may allow delaying occurrence of swelling in a battery. In an embodiment, the control module 104 selects charging profiles which are configured to delay swelling. Such a charging profile may, for example, comprise one or more of: a lower charging voltage; charging only when battery temperature is within a pre-specified range and a lower charging current. The combinative parameter and at least one threshold may be defined such that when the combinative parameter passes a threshold, it may indicate onset of swelling and/or loss of usable battery capacity. The control module 104 may then select a charging profile which may delay battery swelling and/or extend battery life. According to an embodiment, space allocated to allow swelling of a battery may be saved by delaying the swelling.

It should be noted that the term "module" is used herein to refer to hardware, software, or a combination of hardware and software which perform a function. It should be further noted that the various modules described herein may be combined and/or disjoined in any manner into any number of modules.

Figure 2:
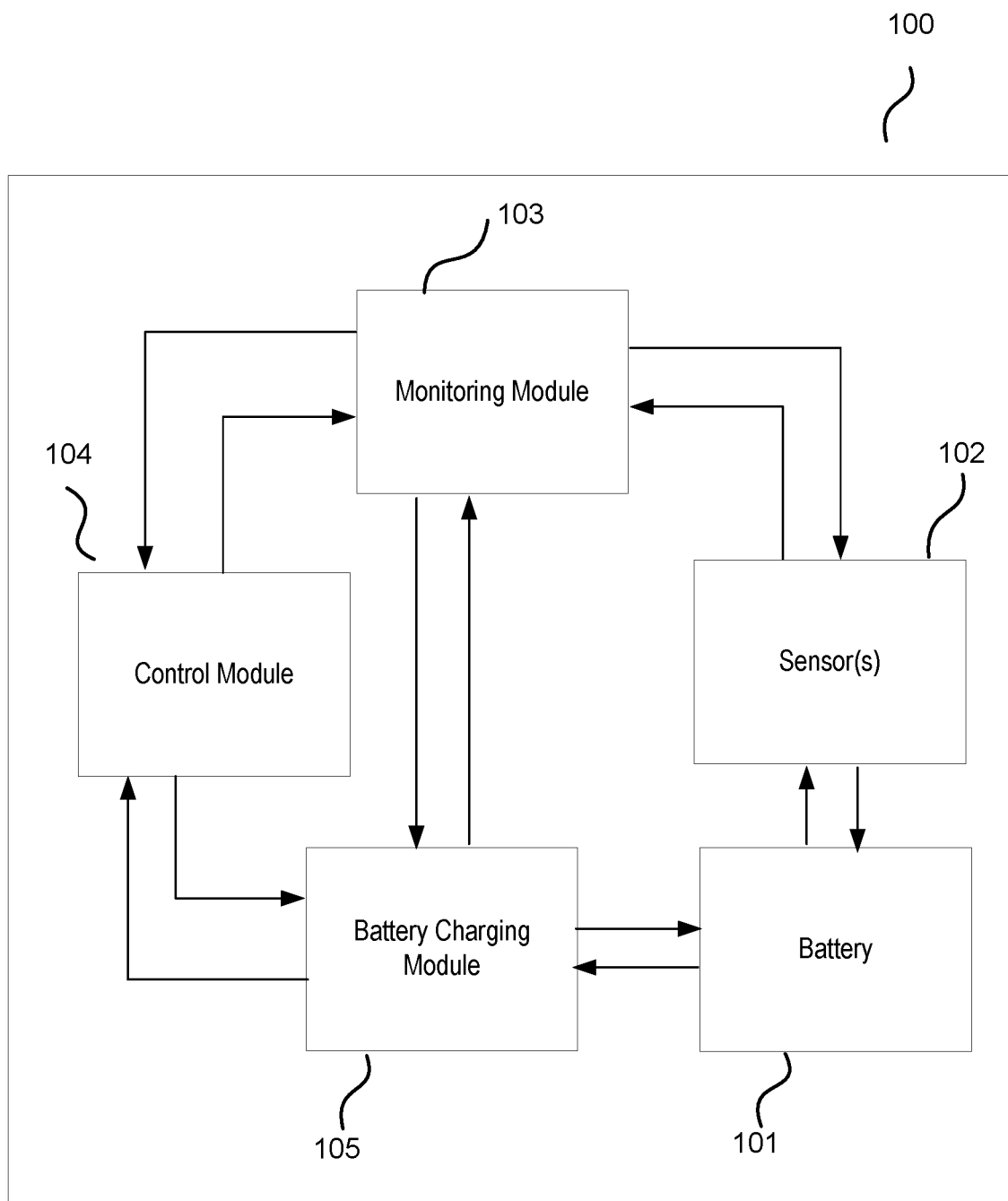
FIG. 2 illustrates a schematic representation of a device with adaptive battery charging according to another embodiment.

An embodiment of device 100 is illustrated in FIG. 2. A device 100 may comprise a battery 101, at least one sensor 102, a monitoring module 103, a control module 104 and a battery charging module 105.

Referring to an embodiment illustrated in FIG. 2, the control module 104 may be in communication with the monitoring module 103 and battery charging module 105. The battery charging module 105 may be in communication with the battery 101. Sensor 102 may be in communication with the battery 101 and the monitoring module 103. Further, the monitoring module 103 may be in communication with the battery charging module 105. In an embodiment, the battery charging module 105 may sense and/or measure battery related parameters including for example impedance, state of charge, number of cycles, and age of battery. The monitoring module 103 may then receive this information from the battery charging module 105 and forward it to the control module 104, which may include this information in computing or selecting a charging profile for the battery 101.

In an embodiment, the battery 101 may comprise an integrated circuit (not illustrated in FIG. 2). The integrated circuit may comprise a storage which may be configured to store information including at least one of: date of manufacture of the battery 101; manufacturer of the battery 101; number of charging cycles of the battery 101; and information relating to chemistry of the battery. This information may be read by the charging module 105, the monitoring module 103, at least one sensor 102, control module, or by a combination thereof. The information may be used by the control module 104 in computing or selecting a charging profile for charging the battery 101. In an embodiment, the integrated circuit may comprise a Battery Interface chip (BIF), such as a BIF specified by Mobile Industry Processor Interface (MIPI) Alliance.

In an embodiment, device 100 may be a smartphone and some or all the functionality ascribed to a monitoring module 103 and/or control module 104 may be implemented in a processor (not illustrated in FIG. 2) and/or a battery charging integrated circuit (charging IC) of the smartphone 100. In an embodiment, the battery charging module 105 may be a battery charging integrated circuit (charging IC) of a smartphone. In an embodiment, a battery charging integrated circuit may implement the functionality ascribed to a monitoring module 103, control module 102 and the battery charging module 105. The battery charging IC may be in direct communication with a battery interface and/or a pressure sensor. In an embodiment, a sensor 102 is a capacitive sensor configured on a battery 101 to measure an outward pressure exerted by the battery 102.

Figure 3:
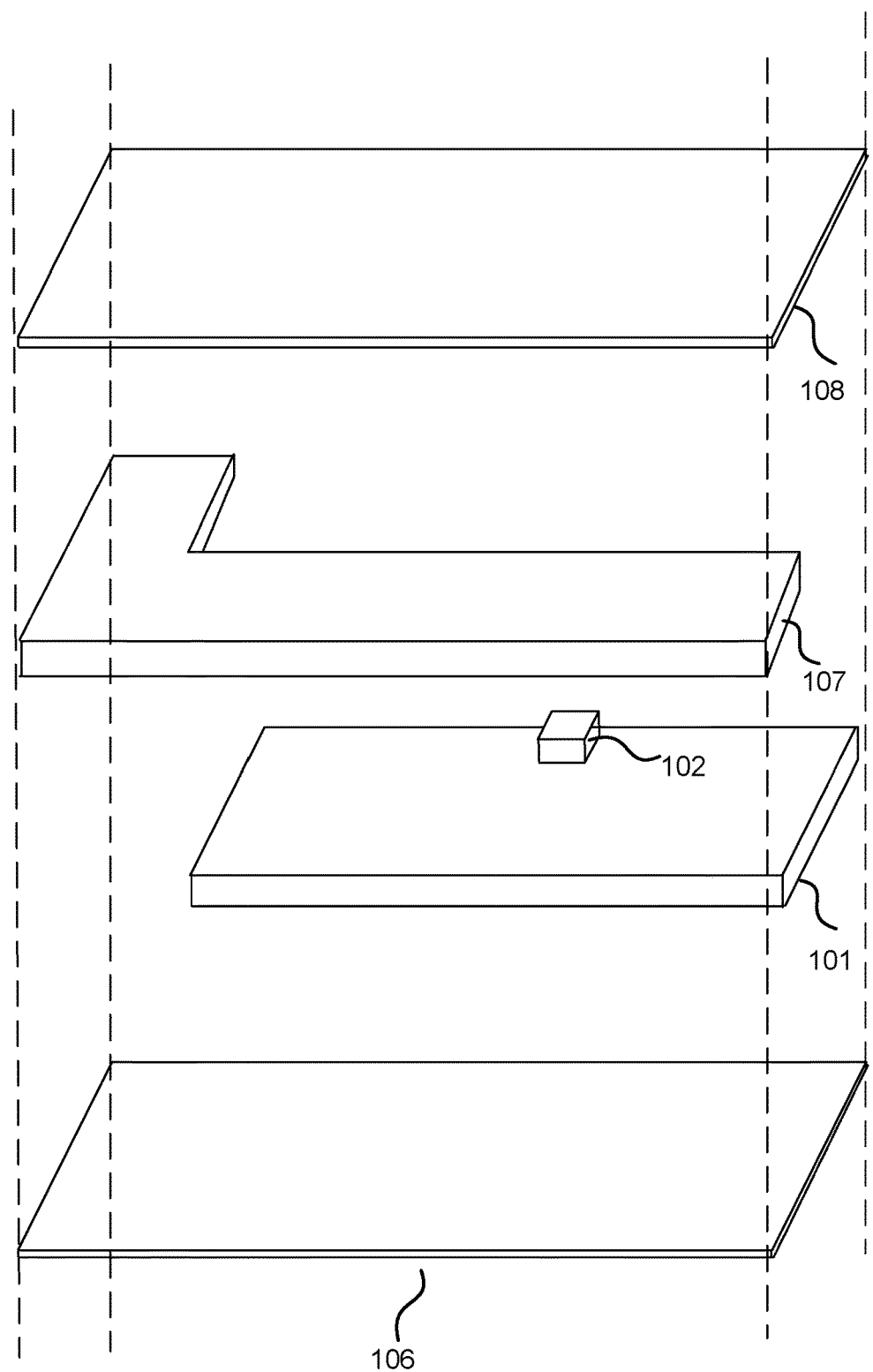
FIG. 3 illustrates a schematic representation of a pressure sensor configured on a battery in a mobile device with adaptive battery charging.

FIG. 3 illustrates a configuration of a sensor 102 configured on a battery 101 in an exploded view of a mobile device 100 according an embodiment. A mobile device may comprise a back cover 106, a battery 101, at least one pressure sensor 102, a printed circuit board (PCB) 107 and a display plate 108. The PCB may comprise a plurality of components (not illustrated in FIG. 3) which may be needed for functioning of the smartphone. According to an embodiment, a PCB in a smart phone may be shaped so as save as much space as possible and leave space for other components, for example, a battery. Further the display plate may be a display of a device 100 or a support structure which supports a display of a device 100.

Referring to an embodiment illustrated in FIG. 3, at least one sensor 102 may be configured in such a way so as to be between the battery 101 and the display plate 108. In an embodiment, a sensor 102 may be configured between the battery 101 and the PCB 107. In an embodiment, a sensor 102 may be configured between a battery 101 and a back cover 106 of a device 100. In some other embodiments, a sensor 102 may be configured between a battery 101 and a chassis (not illustrated in FIG. 3) of a device 100. According to an embodiment, a chassis may be any element configured to provide at least some structural strength to the device. In some embodiment's sensor 102, is a capacitive sensor configured to measure an outward pressure exerted by the battery 101.

The term 'computer', 'computing-based device', 'apparatus' or 'mobile apparatus' is used herein to refer to any device with processing capability such that it can execute instructions. Those skilled in the art will realize that such processing capabilities are incorporated into many different devices.

Figure 4:
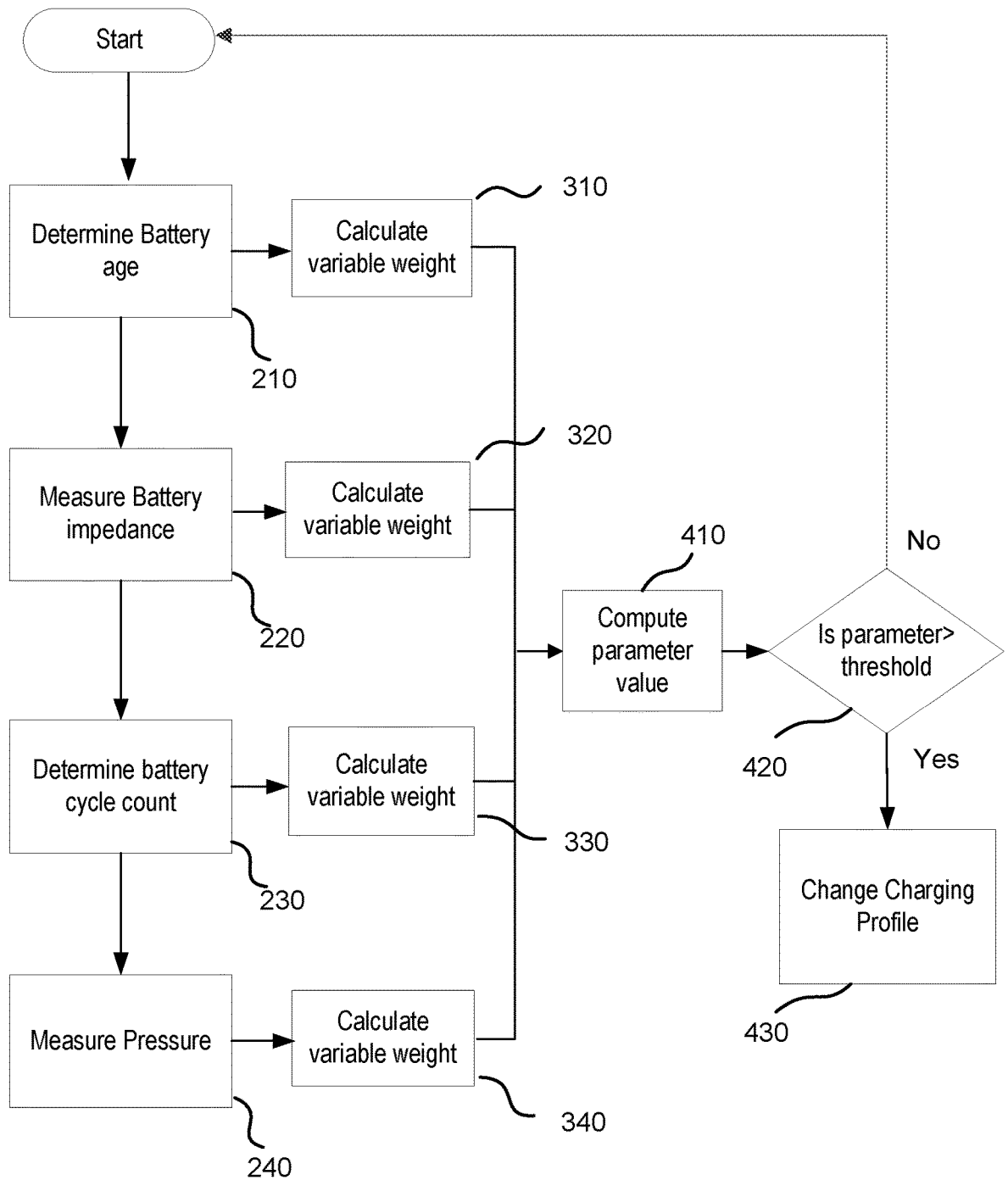
FIG. 4 illustrates a schematic representation of a method of adaptive battery charging according to an embodiment.

An embodiment of a method to adaptively charge a battery is illustrated in FIG. 4 as functional flow diagram.

Referring to the illustrations in FIG. 4, according to an embodiment a method comprises the following steps. In step 210, an age of a battery 101 may be calculated. Age of a battery may be calculated from the date of manufacture of the battery 101 and/or the date of manufacture of the device 100 in which the battery 101 is configured. In step 310 a weight may be assigned to battery age calculated in step 210. This weight may be selected from a range or set of weights specified at the time of manufacture or it may be dynamically computed during operation. In an embodiment, weight assigned to age of the battery may depend upon, among other factors, age, manufacturer, chemistry of the battery 101, or a combination thereof. In step 220, an impedance of the battery 101 may be measured. Impedance of a battery 101 may be measured multiple times to get an average value. In an embodiment, impedance of the battery 101 may be measured only within particular battery voltage and/or load current ranges. In an embodiment, battery impedance may be measured only within a particular temperature range. In step 320 a weight may be assigned to battery impedance measured in step 220. In step 320, the weight assigned to battery impedance may be selected from a range or set of weights pre-specified at the time of manufacture or it may be computed dynamically. In an embodiment, the weight assigned to battery impedance may depend upon, among other factors, battery voltage level, battery state of charge, battery age, or a combination thereof. In step 230, a count of battery charge/discharge cycles may be determined. In an embodiment, a count of battery charge/discharge cycles may be stored on an integrated chip configured on the battery 101. In some other embodiments, a count of battery charge/discharge cycles may be stored in a storage on the device 100. In step 330, a weight may be assigned to the battery cycle count determined in step 230. In step 330, the weight assigned to a battery cycle count may be selected from a range or set of weights pre-specified at the time of manufacture or it may be computed dynamically. In an embodiment, the weight assigned to a battery cycle count may depend upon, among other factors, state of charge (SOC), cycle count, age, or a combination thereof. In step 240, an outward pressure exerted by the battery 101 may be measured. In an embodiment a rate of change of an outward pressure may also be measured. In an embodiment, pressure may be measured only when battery voltage and/or battery temperature are within a pre-specified range. In step 340 a weight may be assigned to an outward pressure exerted by the battery 101 measured in step 240. In step 340, the weight assigned to an outward pressure exerted by the battery 101 may be selected from a range or set of weights pre-specified at the time of manufacture or it may be computed dynamically. In an embodiment, the weight assigned to battery impedance may depend upon, among other factors, battery voltage level, battery state of charge, battery age, or a combination thereof.

In step 410, a combinative parameter may be computed. This combinative parameter may be based upon: a battery age and its assigned weight; a battery impedance and its assigned weight; a battery cycle count and its assigned weight; and an outward battery pressure and its assigned weight. In an embodiment, the combinative parameter may further be based upon at least one of: temperature of the battery; load current of the battery; battery usage history; change in physical dimensions of the battery etc. In step 420, the combinative parameter computed in step 410 may be compared with one or more thresholds. These thresholds may be pre-specified at the time of manufacture or they may be computed during the lifetime of a battery. The comparison may lead to change of charging profile as indicated in step 430, in case a threshold has been passed. The comparison may lead to a repeat of the method, in case a threshold is not passed.

In an embodiment, in at least one of the steps 310, 320, 330, and 340, a weight assigned to a battery related variable may be such that the effect of that particular variable on a combinative parameter computed in step 410 may be nullified. In an embodiment, the weight assigned to a battery related variable may be such that so as to nullify the effect of other battery related variables on a combinative parameter. This may be done, for example, in case of an extreme value of an individual battery related variable. According to an embodiment, battery related variables include, non-exhaustively, battery age, battery impedance, battery temperature, battery cycle count, an outward pressure exerted by the battery etc.

Figure 5A:
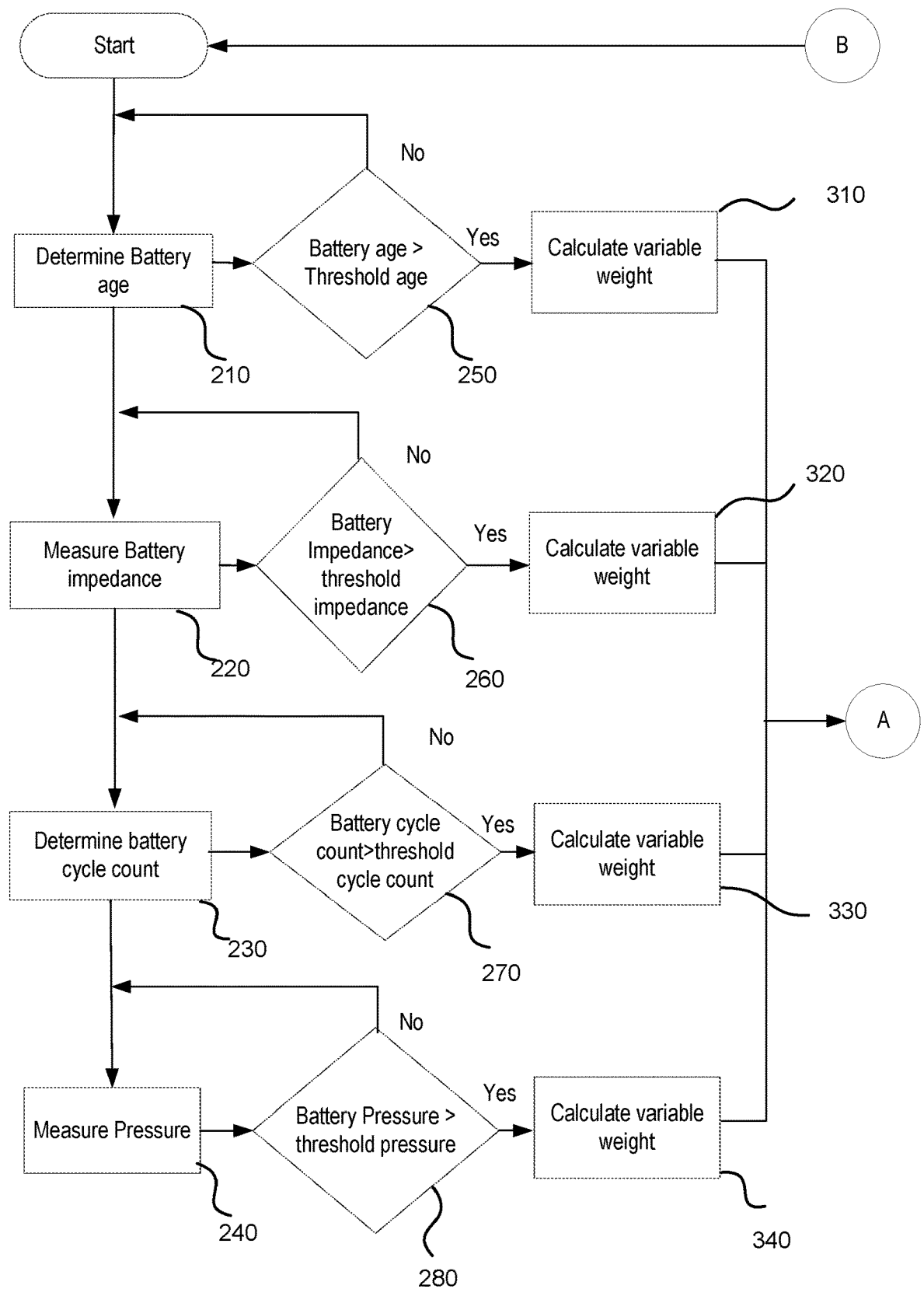
FIGS. 5A and 5B illustrate a schematic representation of a method of adaptive battery charging according to another embodiment.
Figure 5B:
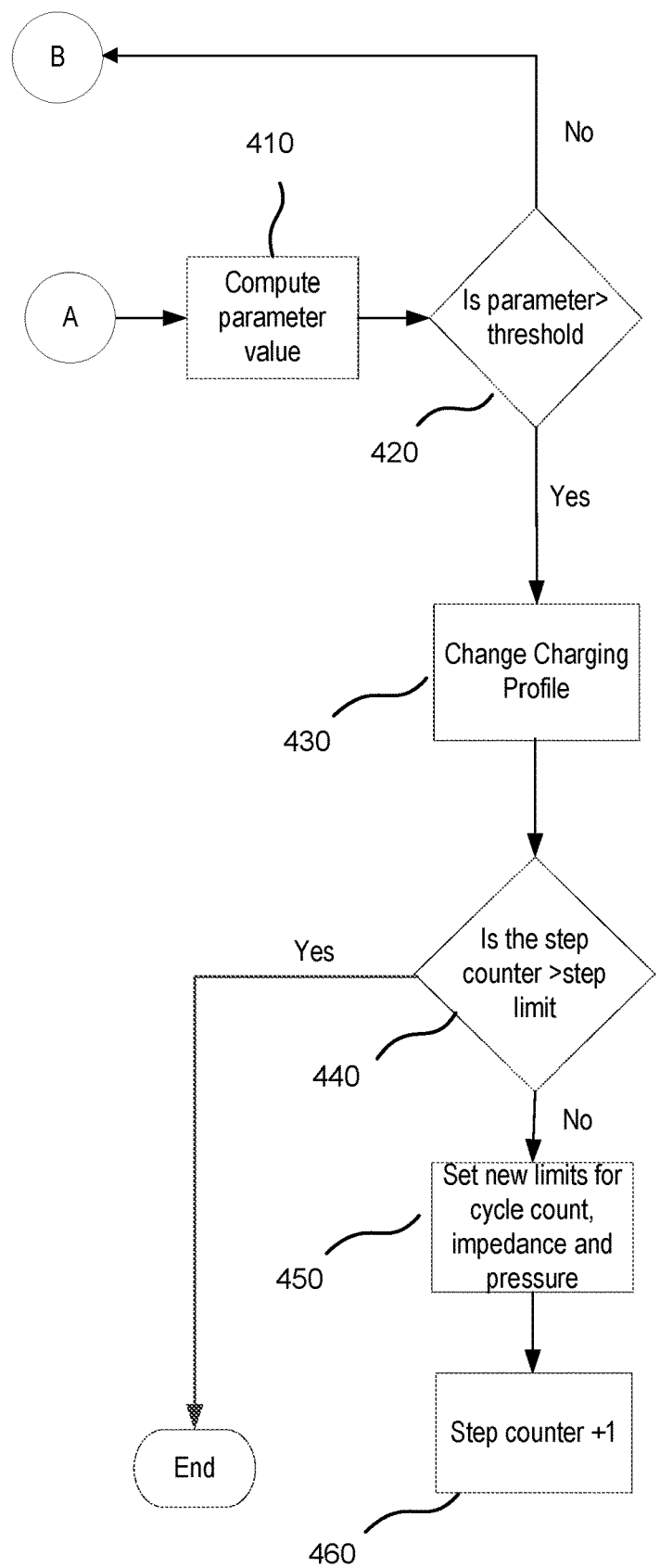

FIG. 5 comprises FIG. 5A and FIG. 5B which illustrate, as a functional flow diagram, a method of adaptively charging a battery according to another embodiment. It should be noted that lines terminating in a circle on one page indicate continuation of the same line on another page. Circles on lines extending across pages are labeled with the same letter on both pages.

The embodiment illustrated in FIG. 5A and FIG. 5B may be similar to the embodiment illustrated in FIG. 4 except that it includes some additional steps. In step 250, battery age determined in step 210 may be compared to a threshold age, and if the threshold age is passed, the battery age may be assigned a weight in step 310. If the threshold age has not been passed, battery age may be determined again. In step 260, measured battery impedance may be compared to a threshold impedance, and if the threshold impedance has been passed, the battery impedance may be assigned a weight in step 320. If the threshold impedance has not been passed, the impedance determination may be repeated. In step 270, battery cycle count determined in step 230 may be compared to a threshold battery cycle count. If the threshold cycle count has been passed, the battery cycle count may be assigned a weight in step 330. If the threshold battery cycle count has not been passed, the determination of cycle count may be repeated. In step 280, measured outward pressure exerted by a battery, determined in step 240, may be compared to a threshold pressure, and if the threshold pressure has been passed, the outward pressure exerted by the battery may be assigned a weight in step 340. If the threshold pressure has not been passed, the pressure measurement step may be repeated. After a new charging profile is set in step 430, a step counter may be checked against a step limit in step 440. If the step count is greater than a step limit, no further changes in charging profiles may be done.

In case the step limit has not been superseded, new thresholds may be set for at least one of: battery age; battery cycle count; battery impedance; and battery pressure in step 450. In step 460, the step counter may be incremented followed by starting over again.

Figure 6A:
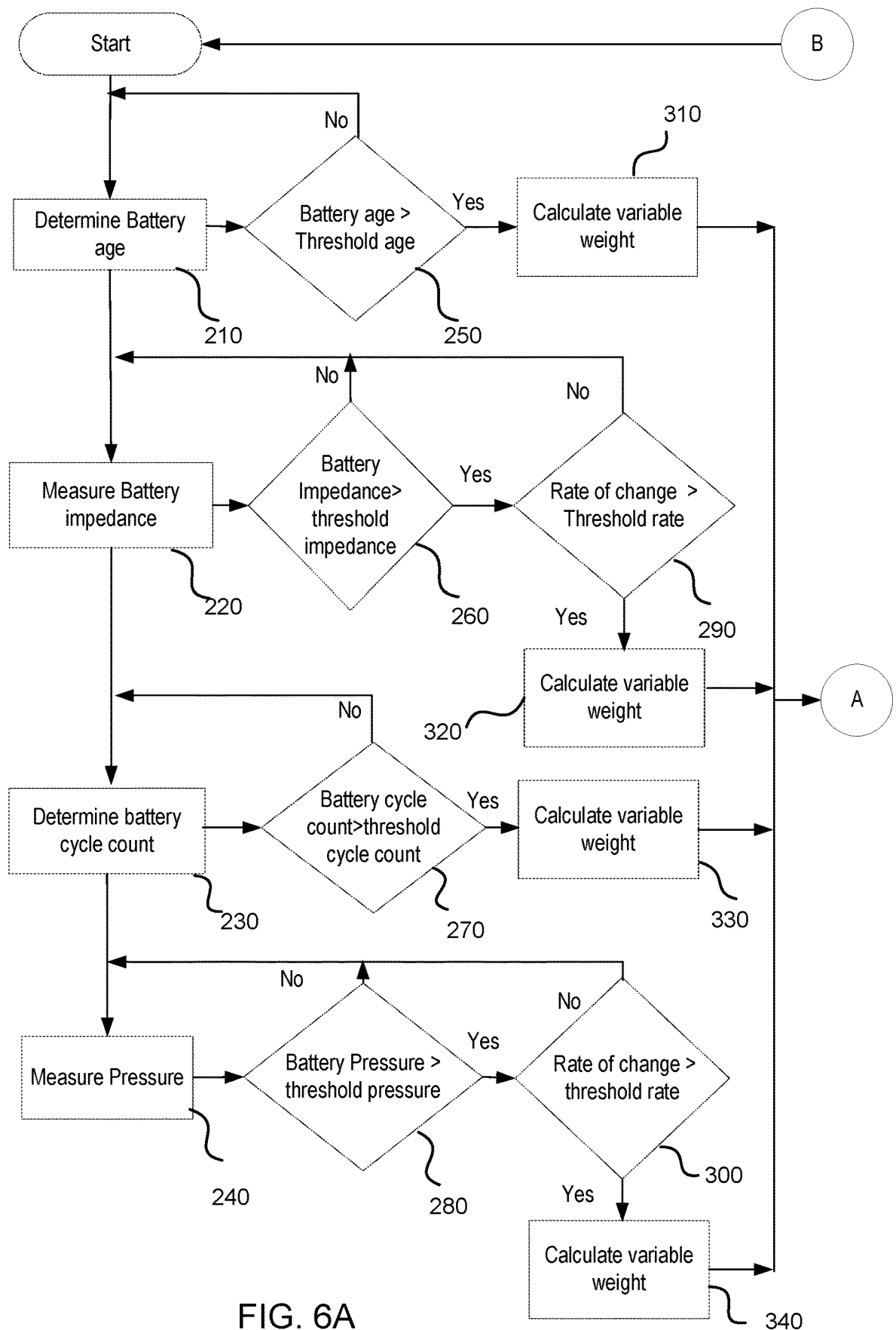
FIGS. 6A and 6B illustrate a schematic representation of a method of adaptive battery charging according to another embodiment.
Figure 6B:
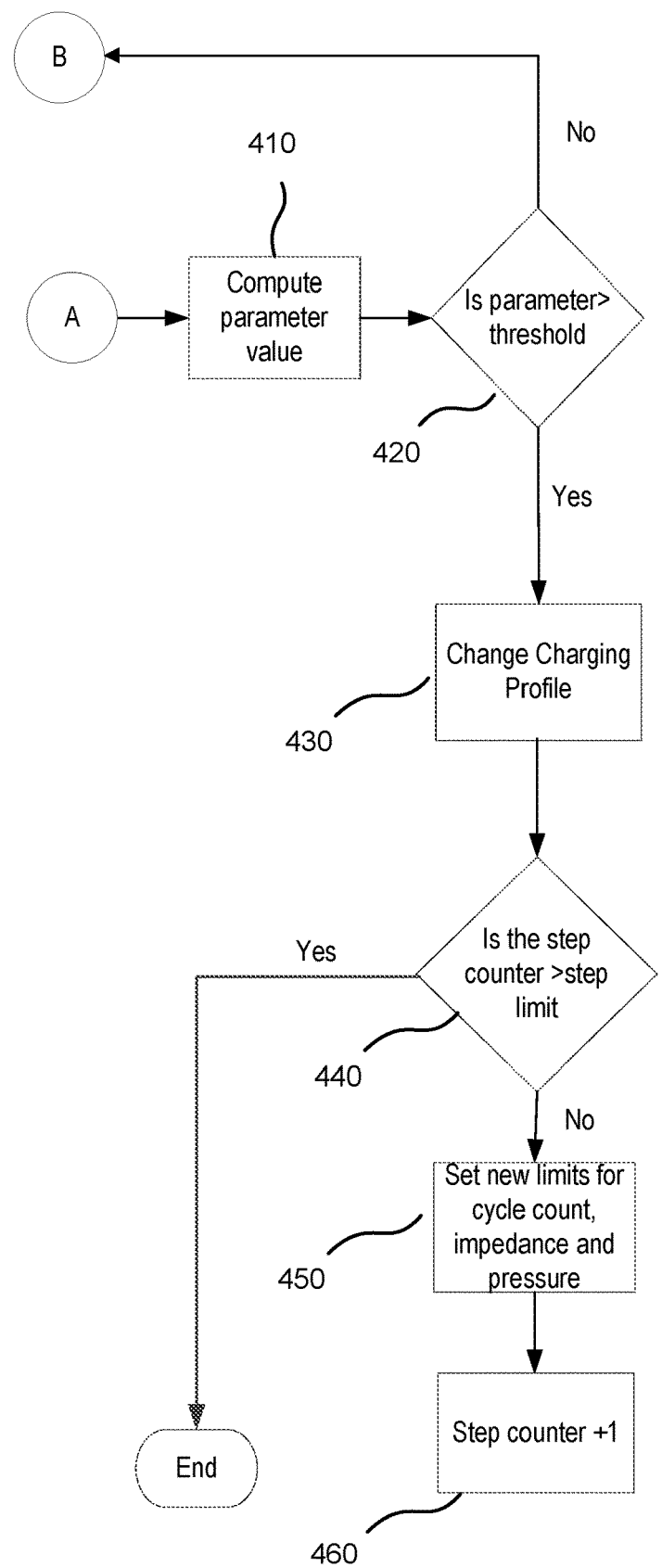

FIG. 6 comprises FIG. 6A and FIG. 6B which illustrate, as a functional flow diagram, a method of adaptively charging a battery according to another embodiment. It should be noted that lines terminating in a circle on one page indicate continuation of the same line on another page. Circles on lines extending across pages are labeled with the same letter on both pages.

The embodiment illustrated in FIG. 6 may be similar to the embodiment illustrated in FIG. 5, except for some additional steps. According to an embodiment, step 260 may be followed by step 290 in which a rate of change of impedance may be compared to a threshold and if the rate is greater than a threshold, step 320 may be executed. In an embodiment, in step 320 the impedance and rate of change of impedance may be assigned separate weights while in another embodiment, they be first combined in some manner and then a weight may be assigned to them for use in step 410. According to an embodiment, step 280 may be followed by step 300 in which a rate of change of pressure may be compared to a threshold and if the rate is greater than a threshold, step 340 may be executed. In an embodiment, in step 340 the pressure and rate of change of pressure may be assigned weights separately while in another embodiment, they may be first combined in some manner and then a weight may be assigned to them in step 340 to be used in step 410.

Figure 7:
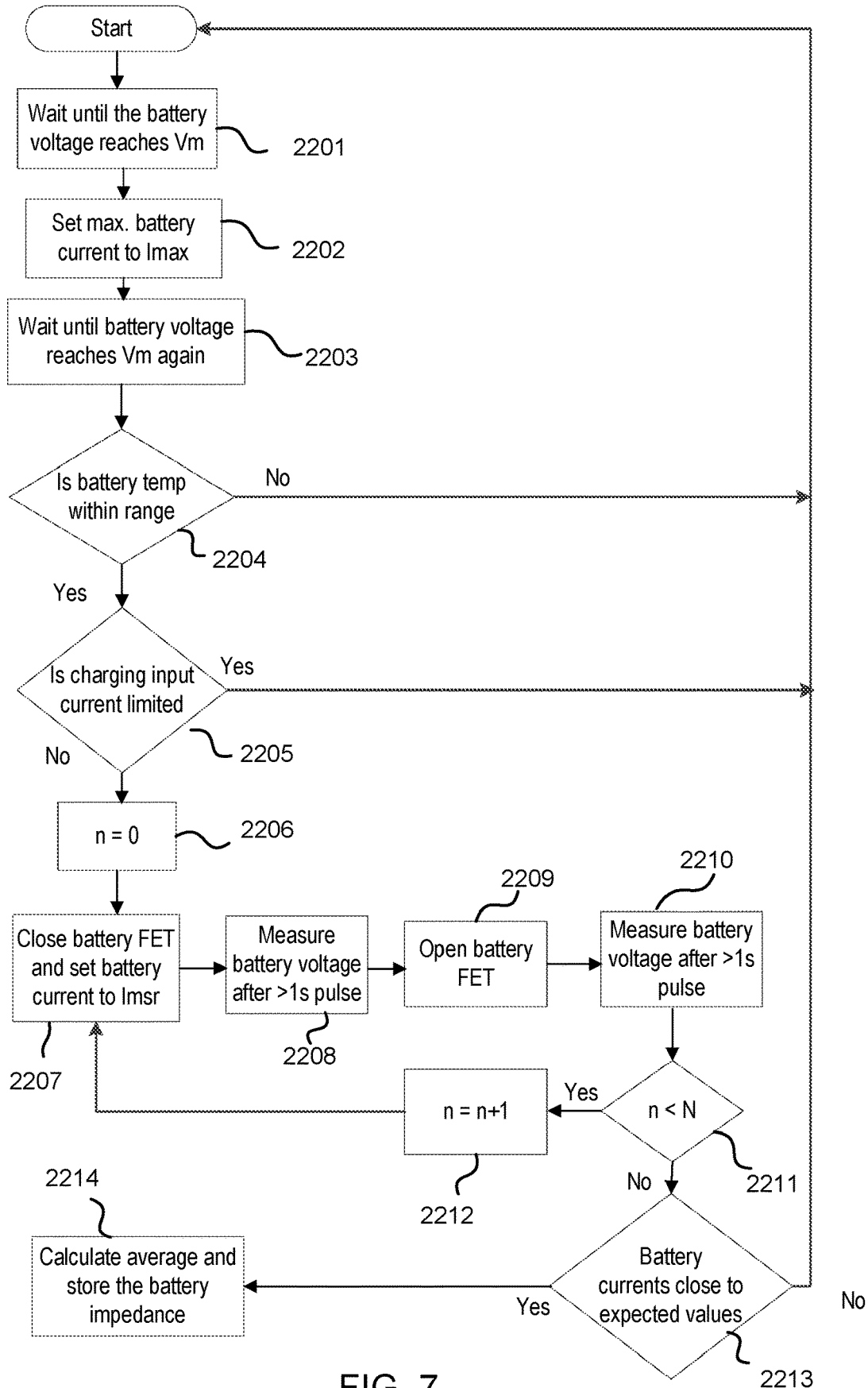
FIG. 7 illustrates a schematic representation of impedance measurement according to an embodiment.

FIG. 7 illustrates a method to measure impedance of a battery as a flow chart according to an embodiment. Step 2201 may include waiting for battery voltage to reach a pre-specified value Vm. In an embodiment, Vm may be 4.1 Volts. In step 2202, the maximum battery charging current may be set to a pre-specified maximum value Imax. In an embodiment, Imax may be 1 Ampere. Step 2203 includes waiting for the battery voltage to reach Vm again. In step 2204, a battery temperature may be checked against a pre specified range of temperature. In an embodiment, this range may be 30° Celsius to 40° Celsius. If the battery temperature is not within range, the measurement of impedance may be started again from step 2201 or it may be stopped for a period of time. If the battery temperature is within the pre-specified range, step 2205 may be performed. In step 2205, the charging current source may be checked. If the charging current source is determined to be current limited, measurement of battery impedance may be started again from step 2201 or it may be stopped. If the charging current source is not current limited, step 2206 may be performed. In step 2206, a counter "n" may be set to 0 to begin counting. In step 2207, a battery Field Effect Transistor (FET) may be closed and battery charging current may be set to a pre specified value Imsr. In an embodiment, Imsr may be 500 milliamperes. According to some embodiments, battery FETs may be used to isolate a battery from a load. Step 2208 includes waiting for a certain period of time, before measuring battery voltage. In step 2209, the battery FET may be opened. In step 2210 a charging current of magnitude Imsr may be applied for a period of time and a battery voltage may be measured. In an embodiment, this period of time of steps 2208 and 2210, during which a charging current of magnitude Imsr is applied may be greater than 1 second. In an embodiment, the time period for which a charging current of magnitude Imsr is applied may be less than or equal to 3 seconds. In step 2211, the counter n may be compared with a pre-specified value N. If n is less than N, it may be incremented by one and steps from 2207 through 2111 may be repeated. If n is equal to N in step 2211, step 2213 is performed. In step 2213 battery currents of step 2207 and 2209 may be checked for unexpected variations from expected values. In case of unexpected variations, measurement may be started again from step 2201. Otherwise, step 2214 may be performed. In step 2214 an average impedance may be calculated from the set of known battery voltages and currents.

In an embodiment, step 220 of embodiments illustrated in FIG. 4 and FIG. 5 may be performed as illustrated in FIG. 7.

Optionally, a pop-up user interface message may be displayed to a user in case the battery has reached end of useful life or in case some battery related variable has passed a threshold value indicative of potentially harmful effects. For example, a user interface popup message may inform the user that the battery may have swollen too much or reached dangerous temperatures.

An embodiment of a device comprises: a battery; at least one sensor configured to sense an outward pressure exerted by the battery; a monitoring module configured to monitor the outward pressure exerted by the battery and at least one of a temperature of the battery, an age of the battery, a manufacturer of the battery, a state of charge of the battery, an impedance of the battery, and a number of charging cycles of the battery; a control module configured to select a charging profile for the battery; and a charging module configured to charge the battery according to the charging profile selected by the control module; wherein: the selection of the charging profile is based on at least one of: the outward pressure exerted by the battery; a rate of change in the outward pressure exerted by the battery; an impedance of the battery; a rate of change of the impedance of the battery; a number of charging cycles of the battery; a temperature of the battery; and an age of the battery.

In an embodiment, alternatively or in addition to the above described embodiments, a single module comprises the monitoring module, control module, and charging module.

In an embodiment, alternatively or in addition to the above described embodiments, at least one of: temperature, age, manufacturer, state of charge, impedance, and number of charging cycles of the battery are determined by the charging module and communicated to the monitoring module.

In an embodiment, alternatively or in addition to the above described embodiments, the device may further include a sensor for sensing temperature.

In an embodiment, alternatively or in addition to the above described embodiments, at least one of the age of the battery and the number of charging cycles of the battery is read from an integrated circuit present in the battery.

In an embodiment, alternatively or in addition to the above described embodiments, the age of the battery is calculated from data available on the device.

In an embodiment, alternatively or in addition to the above described embodiments, battery impedance is measured within a pre-specified range of at least one of: battery temperature and battery voltage.

In an embodiment, alternatively or in addition to the above described embodiments, the measured battery impedance is measured as an average of repeated measurements.

In an embodiment, alternatively or in addition to the above described embodiments, the number of charging cycles of the battery is stored in the integrated circuit present in the battery.

In an embodiment, alternatively or in addition to the above described embodiments, at least one of pressure and rate of change of pressure is measured within a pre-specified range of at least one of: battery temperature and battery voltage.

In an embodiment, alternatively or in addition to the above described embodiments, at least one charging profile comprises setting at least one of: a charging voltage range, a charging current range, a charging temperature range, a state of charge range.

In an embodiment, alternatively or in addition to the above described embodiments, at least one charging profile comprises at least one of: a lower than normal charging voltage; a lower than nominal charging current; a narrower than nominal charging temperature.

In an embodiment, alternatively or in addition to the above described embodiments, at least one charging profile comprises not charging the battery.

In an embodiment, alternatively or in addition to the above described embodiments, at least one charging profile includes a user interface pop-up message to alert a user.

In an embodiment, alternatively or in addition to the above described embodiments, at least one charging profile is configured to at least one of delay and control swelling.

In an embodiment, alternatively or in addition to the above described embodiments, at least one charging profile is configured to extend battery life.

An embodiment of a mobile device comprises: a battery; at least one capacitive sensor configured to sense an outward pressure exerted by the battery; a monitoring module configured to monitor the outward pressure exerted by the battery and at least one of a temperature of the battery, an age of the battery, a manufacturer of the battery, a state of charge of the battery, an impedance of the battery, and a number of charging cycles of the battery; a control module configured to select a charging profile for the battery; and a charging module configured to charge the battery according to the charging profile selected by the control module; wherein: the selection of the charging profile is based on whether at least one threshold value has been passed by a combinative parameter, the combinative parameter being based on at least one of: the outward pressure exerted by the battery; a rate of change in the outward pressure exerted by the battery; an impedance of the battery; a rate of change of the impedance of the battery; a number of charging cycles of the battery; and an age of the battery.

In an embodiment, alternatively or in addition to the above described embodiments, the combinative parameter is based at least in part upon dimensions of a battery slot.

In an embodiment, alternatively or in addition to the above described embodiments, the combinative parameter comprises a weighted sum of a value of swelling; a value of rate of swelling; a value of impedance; a value of rate of change of impedance; number of charging cycles of the battery and an age of the battery.

An embodiment of a method of charging a battery comprises: determining an age of the battery; determining an impedance of the battery; determining a cycle count of the battery; determining an outward pressure exerted by the battery; and selecting a charging profile for charging the battery based on at least one of the determined age, impedance, cycle count, and an outward pressure exerted by the battery.

The methods and functionalities described herein may be operated by software in machine readable form on a tangible storage medium e.g. in the form of a computer program comprising computer program code means adapted to perform all the functions and the steps of any of the methods described herein when the program is run on a computer and where the computer program may be embodied on a computer readable medium. Examples of tangible storage media include computer storage devices comprising computer-readable media such as disks, thumb drives, memory etc. and do not include propagated signals. Propagated signals may be present in a tangible storage medium, but propagated signals per se are not examples of tangible storage media. The software can be suitable for execution on a parallel processor or a serial processor such that the method steps may be carried out in any suitable order, or simultaneously.

This acknowledges that software can be a valuable, separately tradable commodity. It is intended to encompass software, which runs on or controls "dumb" or standard hardware, to carry out the desired functions. It is also intended to encompass software which "describes" or defines the configuration of hardware, such as HDL (hardware description language) software, as is used for designing silicon chips, or for configuring universal programmable chips, to carry out desired functions.

Those skilled in the art will realize that storage devices utilized to store program instructions can be distributed across a network. For example, a remote computer may store an example of the process described as software. A local or terminal computer may access the remote computer and download a part or all of the software to run the program. Alternatively, the local computer may download pieces of the software as needed, or execute some software instructions at the local terminal and some at the remote computer (or computer network). Alternatively, or in addition, the functionality described herein can be performed, at least in part, by one or more hardware logic components. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

Any range or device value given herein may be extended or altered without losing the effect sought. Also any example may be combined to another example unless explicitly disallowed.

Although the subject matter has been described in language specific to structural features and/or acts, it is to be understood that the subject matter defined in the appended claims is not necessarily limited to the specific features or acts described above. Rather, the specific features and acts described above are disclosed as embodiments of implementing the claims and other equivalent features and acts are intended to be within the scope of the claims.

It will be understood that the benefits and advantages described above may relate to one embodiment or may relate to several embodiments. The embodiments are not limited to those that solve any or all of the stated problems or those that have any or all of the stated benefits and advantages. It will further be understood that reference to 'an' item refers to one or more of those items.

The steps of the methods described herein may be carried out in any suitable order, or simultaneously where appropriate. Additionally, individual blocks may be deleted from any of the methods without departing from the spirit and scope of the subject matter described herein. Aspects of any of the embodiments described above may be combined with aspects of any of the other embodiments described to form further embodiments without losing the effect sought, or without extending beyond the disclosure.

The term 'comprising' is used herein to mean including the method, blocks or elements identified, but that such blocks or elements do not comprise an exclusive list and a method or apparatus may contain additional blocks or elements.

It will be understood that the above description is given by way of example only and that various modifications may be made by those skilled in the art. The above specification, examples and data provide a complete description of the structure and use of exemplary embodiments. Although various embodiments have been described above with a certain degree of particularity, or with reference to one or more individual embodiments, those skilled in the art could make numerous alterations to the disclosed embodiments without departing from the spirit or scope of this specification. In particular, the individual features, elements, or parts described in the context of one example, may be connected in any combination to any other example also.

The invention claimed is:

1. An apparatus, comprising:
a battery; and
one or more processors programmed to:
monitor a voltage level of the battery;
wait until the monitored voltage level of the battery reaches a pre-specified voltage value ($V_M$);
monitor an impedance of the battery;
select a charging profile for the battery based, at least in part, on the impedance of the battery to the threshold rate of change of impedance;
charge the battery according to the selected charging profile, wherein said charging profile comprises performing:
based on the monitored voltage level of the battery reaching $V_M$, setting a charging current from a charging source to a pre-set maximum charging current ($I_M$);
determining whether the charging source is a current limited source;
based on said determination, iteratively performing the following steps until a counter value (n) reaches a max count (N):
isolating the battery from a load,
applying a different charging current ($I_{MSR}$) that is less than $I_M$ for a preset time,
measuring the voltage level of the battery after applying $I_{MSR}$, and
incrementing the counter value n.

2. The apparatus of claim 1, further comprising monitoring the impedance of the battery is performed because the monitored voltage level of the battery being is determined to be within a preset voltage range.

3. The apparatus of claim 2, wherein said monitoring the impedance of the battery is performed because a monitored current level of the battery is determined to be within a preset current range.

4. The apparatus of claim 3, further comprising a sensor for sensing temperature of the battery after the charging current is set to $I_M$.

5. The apparatus of claim 1, wherein the one or more processors are programmed to:
read an age of the battery from an integrated circuit present in the battery; and
select a charging profile based, at least in part, on said age of the battery read from the integrated circuit.

6. The apparatus of claim 1, further comprising:
measuring an impedance of the battery; and
assigning a weight to the monitored impedance adjusted based on an age of the battery.

7. The apparatus of claim 1, wherein the one or more processors are programmed to:
measure battery impedance while a temperature of the battery is within a pre-specified range; and
select a charging profile for the battery based, at least in part, on the measured battery impedance.

8. The apparatus of claim 7, wherein the measured battery impedance is measured as an average of repeated measurements.

9. The apparatus of claim 1, wherein a number of charging cycles of the battery is stored in the integrated circuit present in the battery.

10. The apparatus of claim 1, wherein the one or more processors are further programmed to measure outward pressure of the battery and base, at least in part, selection of a charging profile for the battery on said measured outward pressure.

11. The apparatus of claim 10, wherein the charging profile comprises at least one of: a charging voltage range, a charging current range, or a state of charge range.

12. The apparatus of claim 1, further comprising:
monitoring impedance of the battery; and
assigning a weight to the monitored impedance of the battery, the weight being dynamically computed during use of the battery.

13. The apparatus of claim 1, wherein a pressure sensor is attached to the battery, positioned between the battery and a printed circuit board (PCB).

14. The apparatus of claim 1, further comprising a user interface configured to display a pop-up message to alert a user of potentially harmful effects to the battery.

15. The apparatus of claim 1, further comprising selecting a charging profile for the battery based on exceeding at least one threshold value by a combination of parameters comprising:
a monitored outward pressure exerted by the battery;
a rate of change in the outward pressure exerted by the battery;
the impedance of the battery;
a state of charge of the battery;
the charging cycles of the battery; or
an age of the battery.

16. The apparatus of claim 1, further comprising monitoring the impedance of the battery while the monitored voltage level of the battery is within a preset voltage range or a monitored current level of the battery being within a preset current range.

17. A mobile device, comprising:
a battery; and
one or more integrated circuits programmed to:
monitor a voltage level of the battery,
wait until the monitored voltage level of the battery reaches a pre-specified voltage value ($V_M$),
monitor an impedance of the battery;
select a charging profile for the battery based, at least in part, on the impedance of the battery to the threshold rate of change of impedance;
charge the battery according to the selected charging profile, wherein said charging profile comprises performing:

based on the monitored voltage level of the battery reaching $V_M$, setting a charging current from a charging source to a pre-set maximum charging current ($I_M$), determining whether the charging source is a current limited source, based on said determination, iteratively performing the following steps until a counter value (n) reaches a max count (N):

isolating the battery from a load, applying a different charging current ($I_{MSR}$) that is less than $I_M$ for a preset time, measuring the voltage level of the battery after applying $I_{MSR}$, and incrementing the counter value n.

18. The mobile device of claim 17, wherein the one or more integrated circuits are further programmed to monitor impedance of the battery when either the charging current reaches a preset current range or the monitored voltage reaches a preset voltage range.

19. The mobile device of claim 17, wherein the one or more integrated circuits are further programmed to select a charging profile based on a weighted sum of variables that indicate a value of swelling, a value of rate of swelling, a value of impedance, the number of charging cycles of the battery, or an age of the battery.

20. A method of charging a battery, comprising:

monitoring an impedance of the battery;

selecting a charging profile for the battery based, at least in part, on the impedance of the battery to the threshold rate of change of impedance; and charging the battery according to the selected charging profile, wherein said charging profile comprises performing:

monitoring a voltage of the battery;

increasing a charging current of the battery to a pre-set maximum charging current ($I_M$);

determining whether the charging source is a current limited source;

based on said determination, iteratively performing the following steps until a counter value (n) reaches a max count (N):

isolating the battery from a load, applying a different charging current ($I_{MSR}$) that is less than $I_M$ for a preset time, measuring the voltage level of the battery after applying $I_{MSR}$, and incrementing the counter value n.

* * * * *